Dec. 15, 1959 J. F. PUDVIN 2,916,806
PLATING METHOD
Filed Jan. 2, 1957
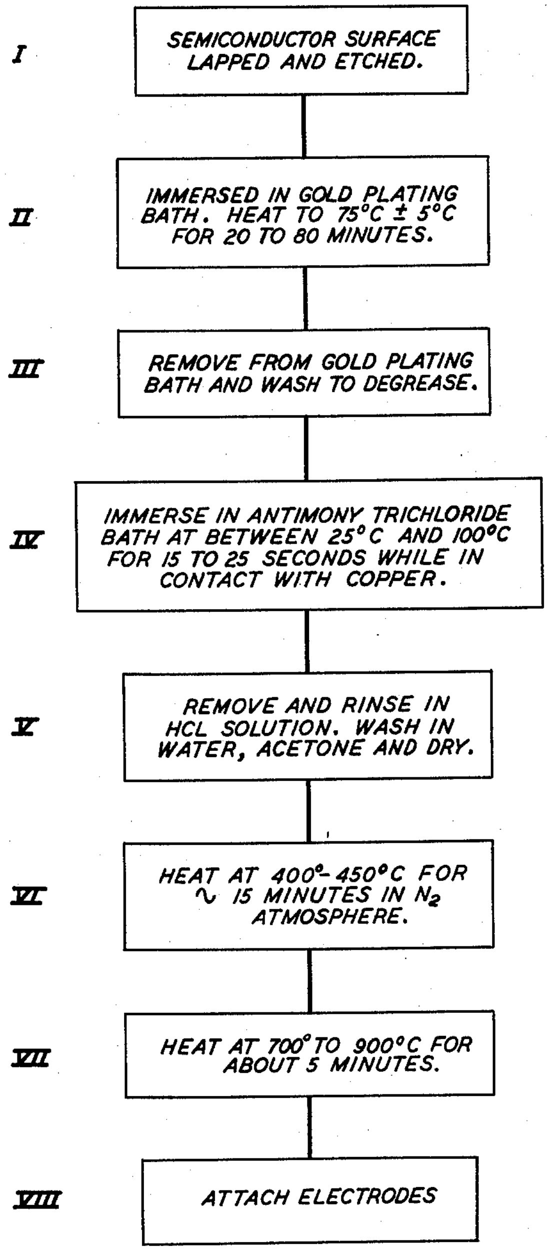
INVENTOR
J. F. PUDVIN
BY H W Lockhart
ATTORNEY

United States Patent Office 2,916,806

Patented Dec. 15, 1959

2,916,806

PLATING METHOD

John F. Pudvin, Bethlehem, Pa., assignor to Bell Telephone Laboratories, Incorporated, New York, N.Y., a corporation of New York Application January 2, 1957, Serial No. 632,228

5 Claims. (Cl. 29—155.55)

This invention relates to a method of making low resistance connections to bodies of silicon and germanium.

In the fabrication of semiconductor signal translating devices, it is customary to provide at least one low resistance connection to the body of the device. In the majority of such semiconductor devices the efficiency of operation is a direct consequence of the character of this low resistance connection and its mechanical strength. In the making of connections of this type, a plating is customarily provided on the surface of the body which may include an element of the type which, when alloyed with the underlying semiconductive material, will increase is conductivity. This plated area thus provides an electrode to which the external lead may be attached readily by soldering or similar means. The use of gold for providing such an electrode is well known. It is likewise known to alloy with the gold those elements which will alter or enhance the conductivity type of the type of semiconductive material.

In the past it has been usual to apply coatings of gold and significant impurity elements by electro-deposition. This method, however, has certain disadvantages, particularly when used with small bodies of the size of usual semiconductor devices.

Electroplating procedures require that electrical contact be made to individual parts either by direct wiring, or jigs, or by mutual contact as in barrel plating. The size and shape of semiconductor bodies make this requirement physically difficult to perform or, at best, an expensive operation. The locations of such contacts as well as jigging marks leave undesirable voids in the plating. Further, where the parts are tumbled or closely spaced in the bath, difficulties arise from semiconductive bodies adhering to one another or otherwise masking surfaces being plated. In addition, electro-deposition techniques may be accompanied by the generation of gas bubbles which contribute to non-uniform coatings. Also, electroplating usually requires the attendance of a skilled operator.

It is, therefore, an object of this invention to enable the facile application of a uniform, low resistance, metallic coating on seimconductive material.

It is a further object of this invention to accomplish such a coating without the application of an external electromotive force, and with a minimum of apparatus and skill.

In accordance with one method of this invention, a coating of gold is first deposited upon a prepared surface of a wafer of silicon or germanium by immersing the wafer in an alkaline solution of potassium gold cyanide for a comparatively short period, generally less than one hour. Next the gold-plated silicon is immersed in an acid solution of antimony trichloride while the wafer being plated is contacted with an active metal, that is, a metal which will displace antimony from the solution. For example, aluminum may be used to contact the semiconductor wafer and antimony is thereby rapidly deposited upon the gold-plated surface of the wafer.

Following these plating steps, the wafer is subjected to successive heat treatments; first, at a comparatively low temperature for the purpose of diffusing the antimony into the gold and then at a more elevated temperature for a shorter period to sinter the gold and antimony partially into the semiconductive material. As a result of this technique, a partial diffusion of antimony into the underlying n-type conductivity material provides a region of higher conductivity. The plated surface furnishes a base to which the external lead may be attached, thereby providing a connection to the semiconductive material which has a desirably low resistance.

A feature of this invention is the deposition in separate, successive steps of a metallic coating and metallic agent for providing the desired conductivity alteration without the use of an external electromotive force. A prime advantage of the electrodeless plating operations of this invention is the high degree of control of plating thicknesses which is achieved.

Another feature of this invention is the heat treatment steps which assure a strongly adherent coating of extremely low electrical resistance.

The invention and its other objects and features will be more clearly understood from a consideration of the following description taken in connection with the drawing which discloses in diagrammatic form steps of an illustrative process in accordance with this invention.

The semiconductive material with which the method of this invention is concerned consists of extremely high purity material, for example of germanium and silicon, prepared by techniques such as those disclosed in the U.S. patents to Little et al. 2,683,676, issued July 13, 1954 or Pfann 2,739,088, issued March 20, 1956. In a specific application of the invention, semiconductive material of this kind was shaped by methods well known in the art generally into a wafer-like form which for a typical device may be 7 mils thick with an area of 1 or 2 square inches. As indicated by block I of the diagram, each such body or wafer was etched, for example, in a solution of concentrated nitric and hydrofluoric acids, after which the face to be plated was lapped lightly with fine (No. 600) carborundum powder. In lieu of this specific etching and polishing process, other cleaning processes involving chemical and mechanical steps, alone or in combination, will be found satisfacory. The wafer was then washed thoroughly and dried.

Next, as indicated in block II, the wafer was immersed with the lapped surface uppermost in the gold-plating solution. This bath was composed as follows:

| | |
|---|---|
| Potassium gold cyanide (67 percent gold) | 10 grams. |
| Potassium hydroxide | 200 grams. |
| Deionized water, to make | 1 liter of solution. |

The solution containing the semiconductive material was then heated slowly from room temperature to about 75 degrees centigrade at a rate of approximately 2 degrees centigrade per minute. For this purpose, the direct radiation of heat onto the top of the bath, approximately 1 inch deep, by means of an infra-red lamp was found preferable to the use of a hot plate under the container. When the plating process began hydrogen gas bubbles were detected originating at the surface of the semiconductive material. Using the bath described above, plating proceeded at a rate of .5 to 1 milligram per square inch per minute. Plating was continued for about an hour by which time a layer of about .0001 inch in thickness, corresponding to a deposit of 25 to 35 milligrams per square inch, had been achieved.

The actual amount of gold deposited may be determined by measuring the increase in weight of the slice. In practice, it has been found that the skilled operator is able to judge when the correct amount of gold has been plated by visual inspection of the slice for color and texture of the deposit. Generally, the length of time needed for the gold-plating step ranges from about 20 to 80 minutes.

It has been found that satisfactory accomplishment of the gold-plating step hinges to a considerable degree upon the proper preparation of the surface to be plated. Thus, the gold will not deposit readily on an etched surface but will adhere to the correctly lapped surface. A further advantage of this particular technique, which in contrast to electroplating has been termed "chemi-plating," is that wafers may be lapped, washed, dried and stored for many hours before plating, whereas the lapped material for electroplating must be plated immediately or reprocessed again. Another remarkable advantage of this particular step is that highly satisfactory coatings may be obtained on materials having a wide range of resistivity values. Heretofore, using electroplating, it has been found difficult to deposit satisfactorily on high resistivity material.

For the deposition of gold on silicon the following expression represents the complete reaction:

$$Si+2KAu(CN)_2+4KOH=2AU+H_2+K_2SiO_3+4KCN+H_2O$$

Although the suggested plating bath indicated hereinbefore contains only 1 percent potassium gold cyanide, $KAu(CN)_2$, satisfactory gold deposits have been obtained with solutions containing up to 5 percent of this gold salt. At these higher concentrations, however, the usefulness of the bath itself may be limited by the amount of the patassium silicate, $K_2SiO_3$, which results from the solution of the silicon. Under certain conditions, the amount of the silicate may increase to the point where its solubility is exceeded, whereupon a white precipitate forms which may deposit on the silicon. For this reason, a gold salt concentration in the range of 1 to 2 percent has been found most advantageous. The concentration of potassium hydroxide (KOH) in the bath has also been varied, and adherent gold platings have been attained with as low as 10 percent of the hydroxide. However, the concentration stated in the above-described bath composition generally is more reliable.

As indicated in block III of the diagram, the gold-plated wafers next were subjected to a cleaning step, by immersion in a solution to insure removal of contaminating films or the like. Following this step, the parts were placed in a metallic, open-work container, for example, of copper mesh, and the entire assembly was immersed in an acid solution of antimony trichloride, as shown in block IV of the diagram.

A satisfactory bath was composed as follows:

| | |
|---|---|
| Antimony trichloride, $SbCl_3$ | 10 grams. |
| Concentrated hydrochloric acid | 100 cubic centimeters. |
| Igepal, CO-730 | 2 cubic centimeters. |
| Deionized water | 1000 cubic centimeters. |

This bath was prepared by dissolving the antimony trichloride in the dilute acid which has been heated to 100 degrees centigrade. The white precipitate which may form upon cooling the solution may be filtered off or removed by settlement. Igepal is the trade name for a product of General Dyestuffs Corporation, 435 Hudson Street, New York 14, N.Y., a division of General Aniline and Film Corporation, and is included as a typical wetting agent to reduce the surface tension and thereby insure immersion in the bath of small, light pieces which might otherwise tend to float.

As would be expected, gold, being less active than antimony, is unable to displace that metal from solution. However, if the gold is contacted with one of the active metals, such as copper, nickel or brass, the antimony will be displaced from solution and deposited on the gold surface. The reference to active metals is intended to denote a metal having a place in the electromotive force series above the reduction potential of appropriate compounds of antimony. In this context, the reduction potential refers to the ease of converting the antimony to the elemental state. Certain other active metals or their alloys, such as aluminium, steel and Kovar, will displace antimony, but the deposit formed is not consistently as satisfactory.

With the wafers immersed in the antimony trichloride bath, plating proceeded at a rate dependent upon the temperature of the bath. For the solution given above, temperatures of from 25 to 100 degrees centigrade were used for different applications of the process. At the lower temperature an immersed time of 15 to 25 seconds was sufficient to produce a slight gray deposit of antimony that was barely visible to the eye. With a boiling solution, a deposit of the same character was obtained in less than 5 seconds. It may be pointed out in connection with the deposition of antimony that the coating provided need not be highly adherent or particularly heavy. An antimony coating is required of sufficient weight and adherence that subsequent heat treatment will produce the desired diffusion of antimony into the gold layer and, further, into the underlying semiconductive material. It will be understood, of course, that antimony is a donor impurity and when alloyed with n-type conductivity material serves to increase its conduitivity.

Thus, it has been found that the most satisfactory results have been obtained by providing a deposit of antimony that is just detectable visually. This has been found to be a deposit of the order of .01 milligram per square inch, which may be achieved with an immersion time of about 20 seconds. Immersion for longer periods, producing heavier antimony deposits, also will insure a low resistance contact. However, an excessive amount of antimony may be deposited which will prove disadvantageous in subsequent high temperature processing.

Following removal from the antimony trichloride bath, the semiconductive material was rinsed in a 1:1 solution of hydrochloric acid to remove excess antimony solution. This step, as set forth in block V of the diagram, also included rinsing in water and acetone, followed by thorough drying.

The semiconductive material was then readied for heat treatments which, in effect, fix the electrode coatings. As shown in block VI, the wafers were subjected to a low temperature sintering operation at a temperature in the range from 400 to 450 degrees centigrade for about 15 minutes in a nitrogen atmosphere. This treatment served to diffuse the antimony into the gold plate and, as a result, restored the original yellow color of the gold coating. This treatment was followed by a final heat treatment, as shown in block VII, for a short period of about 5 minutes at a higher temperature, for example, from 700 to 900 degrees centigrade. This step alloyed the gold and antimony into the semiconductive material and insured the formation of a high conductivity region in the semiconductive material immediately adjacent the plated area.

Following the final heat treatment, further processing of the semiconductive material proceeded in accordance with techniques well known in the art. As indicated in block VIII of the diagram, this included the application of an external lead to the plated area by a soldering operation or the like.

In addition to plating solutions using a compound of antimony to provide a doping agent, chemi-plating baths for depositing bismuth and arsenic have likewise been found useful for providing ohmic connections to n-type germanium and silicon. In this connection, similar baths may be used which include arsenic or bismuth compounds in lieu of the antimony trichloride.

In addition, good low resistance connections to semiconductive bodies have been made by applying the metallic coatings to the metal electrode members, for example aluminum strips, instead of directly to the semiconductor body. This is done in substantially the same fashion as disclosed hereinbefore for plating the semiconductive material. In some instances, this process may be modified so that a heat treatment is accomplished subsequent to each plating step instead of doing all of the heat treatment after both plating operations.

An additional operation then, of course, is required to bond the plated electrode to the semiconductor. This step, a gold bonding process, requires heating of the assembly to the temperature range of the gold-semiconductor eutectic.

While specific embodiments of this invention have been disclosed, it will be understood that they are but illustrative and that various modifications may be made therein without departing from the scope and spirit of the invention.

What is claimed is:

1. In the fabrication of a semiconductor device the method of producing an ohmic electrode to a body of n-type conductivity material which comprises immersing said body in an alkaline solution of a gold compound thereby to provide a gold coating on said portion and removing said body, then immersing said body in an acid solution of a compound of a metal selected from the group consisting of antimony, arsenic and bismuth while contacting said body with a metal selected from a group consisting of those metals having a place in the electromotive force series above the reduction potential of said compound of antimony, arsenic, or bismuth, thereby to deposit a coating of the metal of said compound on said gold coating and removing said body, then heating said body at a temperature from 400 to 450 degrees centigrade for about 15 minutes, then heating said body at from 700 to 900 degrees centigrade for about 5 minutes, and applying an external lead to said coating on said body.

2. In the fabrication of a semiconductor device the method of producing a plated area for making an ohmic contact on the surface of a semiconductor body which comprises cleaning said surface, immersing said body in a solution comprising potassium gold cyanide, potassium hydroxide and water for a period of 20 to 80 minutes at a temperature of about 75 degrees centigrade and removing said body, then immersing said body in an acid solution of a compound of a metal selected from the group consisting of antimony, arsenic and bismuth while contacting said body with a metal selected from the group consisting of those metals having a place in the electromotive force series above the reduction potential of said compound of antimony, arsenic, or bismuth, and removing said body, then heating said body at a temperature of from 400 to 450 degrees centigrade for about 15 minutes, then heating said body at from 700 to 900 degrees centigrade for about 5 minutes, and applying an external lead to said plated area.

3. In the fabrication of a semiconductor device the method of producing a plated area for making an ohmic contact on the surface of a body of semiconductive material selected from the group consisting of germanium and silicon which comprises cleaning said surface, immersing said body in a solution comprising 10 grams of potassium gold cyanide, 200 grams of potassium hydroxide and 1 liter of water, heating said solution to a temperature of about 75 degrees centigrade for a period of from 20 to 80 minutes and removing said body, then immersing said body in an acid solution of a compound selected from the group consisting of salts of antimony, arsenic and bismuth while contacting said body with a metal selected from the group consisting of those metals having a plate in the electromotive force series above the reduction potential of said compound of antimony, arsenic, or bismuth, and removing said body, then heating said body at a temperature of from 400 to 450 degrees centigrade for about 15 minutes, then heating said body at a temperature of from 700 to 900 degrees centigrade for about 5 minutes, and applying an external lead to said plated area.

4. In the fabrication of a semiconductor device the method of producing a plated area for making an ohmic contact on the surface of a body of semiconductive material selected from the group consisting of germanium and silicon which comprises cleaning said surface, immersing said body in a solution comprising 10 grams of potassium gold cyanide, 200 grams of potassium hydroxide and 1 liter of water, heating said solution to a temperature of about 75 degrees centigrade for a period of from 20 to 80 minutes and removing said body, then immersing said body in a solution comprising 10 grams of antimony trichloride, 100 cubic centimeters of concentrated hydrochloric acid and 1000 cubic centimeters of water while contacting said body with a metal selected from the group consisting of those metals having a place in the electromotive series above the reduction potential of antimony and removing said body, then heating said body at a temperature of from 400 to 450 degrees centigrade for about 15 minutes, then heating said body at a temperature of from 700 to 900 degrees centigrade for about 5 minutes, and applying an external lead to said plated area.

5. In the fabrication of a semiconductor device the method of producing a plated area for making an ohmic contact on the surface of a semiconductor body which comprises etching and polishing said surface of said body, immersing said body in a solution comprising 10 grams of potassium gold cyanide, 200 grams of potassium hydroxide and 1 liter of water, heating said solution to a temperature of about 75 degrees centigrade for a period of from 20 to 80 minutes and removing said body, then immersing said body in a solution comprising 10 grams of antimony trichloride, 100 cubic centimeters of concentrated hydrochloric acid and 1000 cubic centimeters of water while contacting said body with a metal selected from the group consisting of copper, nickel, brass and aluminum and removing said body, then heating said body at a temperature of from 400 to 450 degrees centigrade for about 15 minutes, then heating said body at a temperature of from 700 to 900 degrees centigrade for about 5 minutes, and applying an external lead to said plated area.

References Cited in the file of this patent

UNITED STATES PATENTS

| | | |
|---|---|---|
| 2,603,693 | Kircher | July 15, 1952 |
| 2,701,326 | Pfann et al. | Feb. 1, 1955 |